United States Patent
Cacciola et al.

[11] Patent Number: 6,033,947
[45] Date of Patent: Mar. 7, 2000

[54] DRIVING CIRCUIT FOR ELECTRONIC SEMICONDUCTOR DEVICES INCLUDING AT LEAST A POWER TRANSISTOR

[75] Inventors: Giovanna Cacciola, Messina; Salvatore Leonardi, Stazzo-Acireale; Gianpiero Montalbano, Tremestrieri Etneo, all of Italy

[73] Assignee: Consorzio per la Ricerca sulla Microelettronica nel Mezzogiorno, Catania, Italy

[21] Appl. No.: 08/929,349

[22] Filed: Aug. 25, 1997

Related U.S. Application Data

[62] Division of application No. 08/549,599, Oct. 27, 1995, Pat. No. 5,708,290.

[30] Foreign Application Priority Data

Oct. 27, 1994 [EP] European Pat. Off. ............. 94830505

[51] Int. Cl.$^7$ .................................................. H01L 21/20
[52] U.S. Cl. ........................... 438/202; 438/205; 438/234
[58] Field of Search ................................... 257/499, 500, 257/501, 506, 547, 550, 565, 592; 438/200, 202, 234, 205

[56] References Cited

U.S. PATENT DOCUMENTS

| | | | |
|---|---|---|---|
| 4,879,584 | 11/1989 | Takagi et al. | 357/43 |
| 4,889,822 | 12/1989 | Musumeci et al. | 437/31 |
| 5,065,212 | 11/1991 | Ohata et al. | 357/42 |
| 5,072,278 | 12/1991 | Paparo et al. | 357/43 |
| 5,512,774 | 4/1996 | Nakagawa et al. | 257/501 |

FOREIGN PATENT DOCUMENTS

| | | | |
|---|---|---|---|
| 0 385 524 A3 | 9/1990 | European Pat. Off. | H01L 27/06 |
| 0 443 326 A3 | 8/1991 | European Pat. Off. | H01L 27/06 |
| 5-283628 | 10/1993 | Japan | H01L 27/088 |

*Primary Examiner*—Donald L. Monlin, Jr.
*Assistant Examiner*—Michael Dietrich
*Attorney, Agent, or Firm*—Theodore E. Galanthay; Kevin S. Ross; Seed and Berry LLP

[57] ABSTRACT

The invention relates to a control circuit for semiconductor devices which is formed on a substrate (1) doped by a first dopant type, the integrated circuit comprising a first epitaxial layer (2) grown on the substrate (1) and doped by the first dopant type, and an isolation well (3) doped by a second dopant type, the control circuit comprising at least a first control transistor (M1) formed in a first well (8) doped by the second dopant type and formed in the insulation well (3). Thus, the control circuit comprises at least one N-channel MOS transistor accommodated within a well in direct contact with the isolation well to eliminate a buried layer that, in prior art arrangements, involved the presence of an undesired parasitic component.

10 Claims, 5 Drawing Sheets

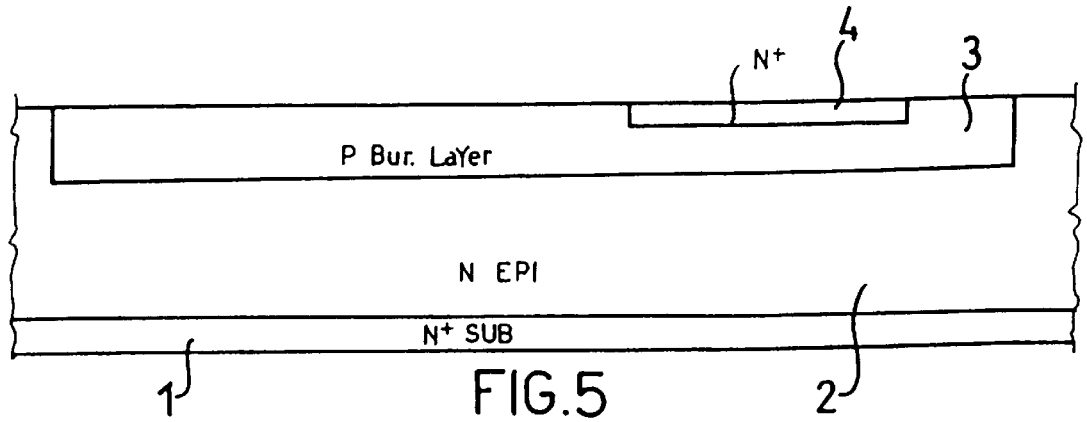
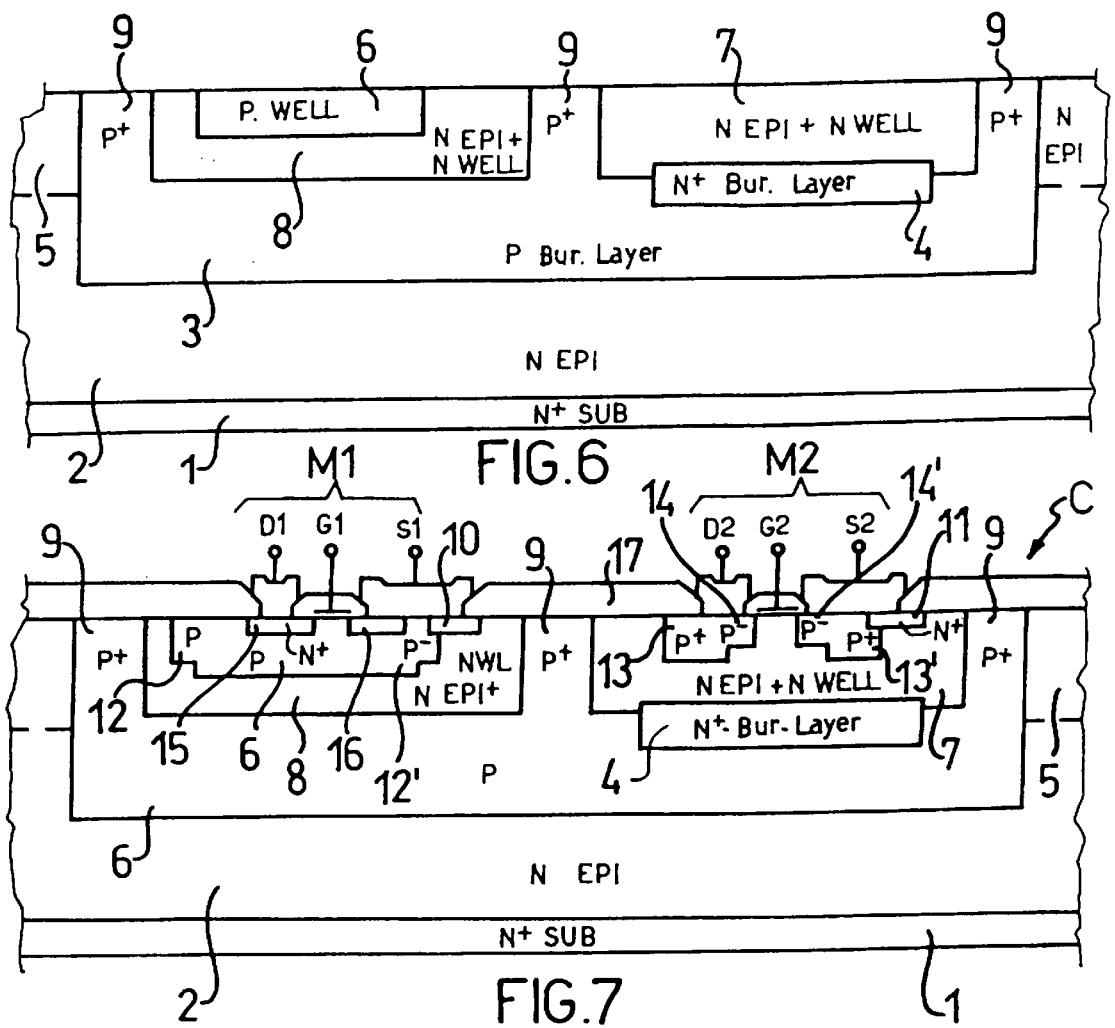

DRIVING CIRCUIT FOR ELECTRONIC SEMICONDUCTOR DEVICES INCLUDING AT LEAST A POWER TRANSISTOR

CROSS-REFERENCE TO RELATED APPLICATION

This application is a divisional of U.S. Ser. No. 08/549,599, now U.S. Pat. No. 5,708,290, filed Oct. 27, 1995.

This application claims priority from EPC App'n 94830505.7, filed Oct. 27, 1994, which is hereby incorporated by reference. However, the content of the present application is not necessarily identical to that of the priority application.

BACKGROUND AND SUMMARY OF THE INVENTION

This invention relates to a control circuit for semiconductor electronic devices which include at least one power transistor.

The invention specifically concerns a control circuit for electronic power devices monolithically integrated on a semiconductor substrate which has been doped by a first dopant type and on which a first epitaxial layer doped by the same dopant type as the substrate has been grown, an isolation well doped by a second type of dopant being formed therein for at least a first transistor of the control circuit.

The invention also relates to a semiconductor electronic device structure, in particular a field-effect transistor.

Further, the invention relates to a process for making the above control circuit and semiconductor device structure.

As is well known, at least one control circuit comprising low voltage operating transistors and at least one high voltage operating power transistor are integrated into many electronic devices.

An isolation structure is used for the control circuit, and its related transistors are integrated in a single well, known as the isolation well, such as the one shown at 3' in FIG. 1.

FIG. 1 shows schematically a semiconductor IC device which has been integrated monolithically in accordance with prior art methods and comprises a control circuit C' and a power transistor TP of the bipolar NPN HV type.

The IC device has a pair of isolation terminals ISO1 and ISO2.

For simplicity of description, the control circuit C' of FIG. 1 has been depicted as having two bipolar components only, namely a transistor T1 of the NPN LV type and a transistor T2 of the PNP LV type.

The control transistors T1 and T2 are accommodated in a single isolation well 3' formed within an epitaxial layer 2' of the N-type grown on a substrate 1' of the N+ type.

The isolation well 3' is virtually a necessity with semiconductor devices of this kind, but involves the appearance of certain parasitic transistors which impair the proper operation of the control circuit.

The formation of each of the control transistors T1 and T2 involves the presence, in the isolation well 3', of respective buried layers 4' and 4" having a dopant type which is the opposite from that of the well 3'. These buried layers 4' and 4" are responsible for the appearance of several parasitic transistors.

A pair of parasitic transistors P1' and P2' are associated with the first control transistor T1. In this respect, FIG. 2 shows, drawn to an enlarged scale, a portion of FIG. 1 where just the transistor T1 and the layer 4' are provided. An equivalent electric circuit of the structure of FIG. 2 is shown in FIG. 3.

During normal operation of the device, when the transistor T1 would be saturated, the base-emitter junction of the parasitic transistor P2' is forward biased and its collector, which is coincident with a contact ISO1 of the isolation well 3', is at a ground reference potential GND. Under these conditions, the transistor P2' will be in the active zone and will inject current into an isolation area 9' which is associated with the contact ISO1 through a resistance Rp being the intrinsic resistance of well 3'.

It is desirable that such a current be prevented from producing a potential difference across the resistance Rp capable of also turning on the other parasitic transistor P1'.

This occurrence may result from the presence of ramp voltages applied to the substrate 1', which can charge a parasitic capacitance Cp, present between the substrate 1' and the well 3', and produce a current flow which can turn on the parasitic transistor P1'.

Likewise, associated with the control transistor T2 is a further pair of parasitic transistors P3' and P4' which add to the parasitic transistor P1'. For convenience of illustration, FIG. 4A is an enlarged view of the structure of the transistor T2, while FIG. 4B shows an equivalent electric circuit of FIG. 4A.

The presence of the parasitic transistor P1' is less critical to the control transistor T2 than to the previous transistor T1 because the emitter of the transistor P1' is at a higher voltage than the ground voltage, and to turn on the transistor P1', its base-emitter junction must be brought up to an even higher value. The current which is forced to flow through the resistance Rp is, therefore, a larger one if compared to the control transistor T1.

In conclusion, in order to prevent the parasitic transistor P1' from conducting, the following would be necessary:

to minimize the resistance Rp present between the transistor P1' and the isolation well 3' contacts ISO1 and ISO2, normally connected to ground GND;

to minimize the current gain of the first parasitic transistor P1'; and to decrease the gain of the other parasitic transistors P2', P3' and P4'.

A first known technical solution to meet such requirements consists of using an isolation well 3' obtained by epitaxial growth rather than implantation followed by dopant diffusion.

In such a manner, the base of the parasitic transistor P1' is more strongly doped, and this brings down the transistor gain.

While being advantageous in many respects, this first solution fails to fully remove the effects of the transistor P1' or of the other parasitic transistors P2', P3', P4' present.

A second solution provides for the use of an intermediate epitaxial layer to make the base of the parasitic transistor P1' broader and more strongly doped, as described in U.S. Pat. No. 4,889,822, for example.

While the provision of this intermediate layer further decreases the gain of the parasitic transistor P1', not even this solution can completely rule out the possibility of the parasitic transistor being turned on.

The technical problem underlying this invention is to provide a control circuit adapted for monolithic integration, with at least one driven power transistor, and having such structural and functional features as to afford a drastic reduction in the parasitic components that appear in previously known solutions in the art.

The solutive idea on which the invention stands is one of providing the control circuit with at least one N-channel MOS transistor placed in a well in direct contact with the isolation well.

Based on this solutive idea, the technical problem is solved by a control circuit for electronic power devices monolithically integrated on a semiconductor substrate (1) which has been doped by a first dopant type (N) and on which a first epitaxial layer (2) doped by the same dopant type (N) as the substrate (1) has been grown, an isolation well (3) doped by a second type (P) of dopant being formed therein for at least a first transistor (M1) of the control circuit, wherein the first transistor (M1) is a field-effect transistor and is formed within a first well (8) in direct contact with the isolation well (3).

The problem is also solved by a process for making a control circuit for electronic semiconductor devices monolithically integrated along with at least one power component, being of a type which comprises a first epitaxial layer growing step carried out using a first dopant type (N), a step of implantation of a second dopant type (P) to define a buried layer for an isolation well (3), and a second growing step of a second epitaxial layer (5), and comprising further implantation steps to first define said isolation well (3), enclosing at least a first well (8) in the second epitaxial layer (5), and subsequently define a second well (6) to accommodate at least one field-effect transistor (M1) and being housed within and in direct contact with said first well (8).

The features and advantages of a device according to this invention will be apparent from the following detailed description of an embodiment thereof, given by way of example and not of limitation with reference to the accompanying drawings.

BRIEF DESCRIPTION OF THE DRAWING

The disclosed inventions will be described with reference to the accompanying drawings, which show important sample embodiments of the invention and which are incorporated in the specification hereof by reference, wherein:

FIGS. 5 and 6 are respective schematic views illustrating in vertical section successive steps of a process for making semiconductor integrated circuits, preliminary to forming the circuit of this invention;

FIG. 7 shows schematically, in vertical section, the structure of a control circuit embodying this invention, at the end of the process steps which result in its formation;

DETAILED DESCRIPTION OF THE PREFERRED EMBODIMENTS

Figure 1:
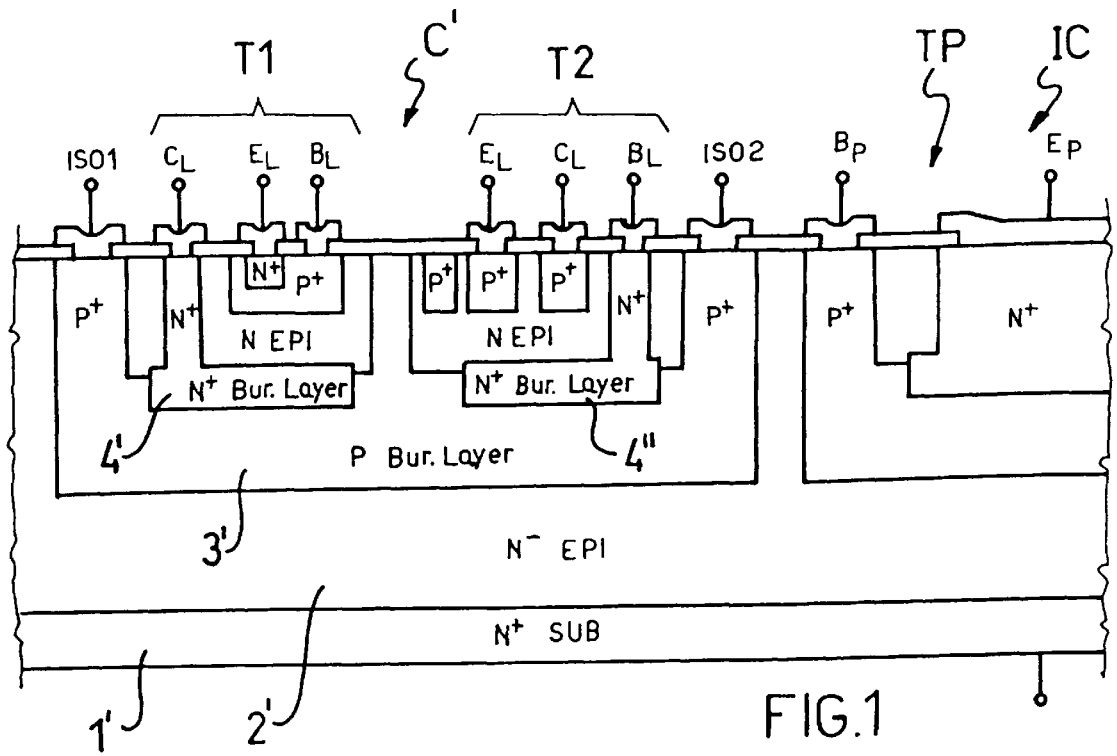
FIG. 1 is a schematic view showing in vertical section a semiconductor to which a control circuit has been integrated in accordance with the prior art.

The numerous innovative teachings of the present application will be described with particular reference to the presently preferred embodiment (by way of example, and not of limitation), in which:

With reference to the drawing figures, and specifically to the example in FIG. 7, generally denoted by the character C is a control circuit embodying this invention.

Omitted from that Figure is a bipolar power transistor TP which is understood to have been conventionally integrated monolithically together with the control circuit C to be driven by the latter.

For simplicity of description, only a control circuit C comprising just two transistors M1 and M2 will be considered for discussion.

Advantageously, in accordance with the invention, such transistors are field-effect, in particular MOS, transistors of the N-channel and the P-channel type, respectively.

Furthermore, they are formed in a single isolation well 3, as will be brought out hereinafter in connection with the circuit manufacturing process.

With reference in particular to FIGS. 5 and 6, on a semiconductor substrate 1 having a high concentration of a dopant of a first type, e.g. of the N+ type, a first growth step is carried out to provide a first epitaxial layer 2 which has the same first dopant type. This first epitaxial layer 2 contains N dopant to a lower concentration than the substrate 1.

Thereafter, a step of implantation and diffusion of a second dopant type, e.g. a P type, is carried out on the epitaxial layer 2, thereby to form an isolation well 3 in the epitaxial layer 2.

The isolation well 3 is then subjected to a third implantation and diffusion step at a high a concentration of the first N+ dopant type to form a layer 4.

The last-mentioned layer 4 will be termed "buried" hereinafter for reasons to be explained.

Advantageously, according to the invention, the buried layer 4 is used to form a single MOS transistor, the P-channel transistor M2.

Subsequently, a fourth growth step is carried out to grow a second epitaxial layer 5 having a low concentration of the first type of N dopant, which low concentration is comparable to that of the first epitaxial layer 2.

A fifth implantation step of the second type of P dopant will result in a second P-well 6 being formed within the second epitaxial layer 5.

A sixth implantation step of the first type of N dopant will provide a third N-well 7 over the buried layer 4. This implant will also affect the epitaxial layer surrounding the P-well 6, raising its dopant concentration.

A subsequent thermal diffusion step will settle the dopings of the wells 6 and 7.

At this time, a seventh implantation step is carried out followed by diffusion of the second type of P dopant. This implant will essentially define three discrete connect channels extending from the semiconductor surface down the isolation well 3.

These connect channels 9 bound the third N-well 7 and a fourth N-well 8 accommodating the P-well 6 over the isolation well 3.

On completion of this process step, the circuit structure will show up as in FIG. 6, with an isolation well 3 accommodating and enclosing two N-wells 7, 8, one being formed over the buried layer 4 and the other housing a P-well 6.

The attention will be directed hereinafter to the making of the active areas of the transistors M1 and M2.

Figure 8:
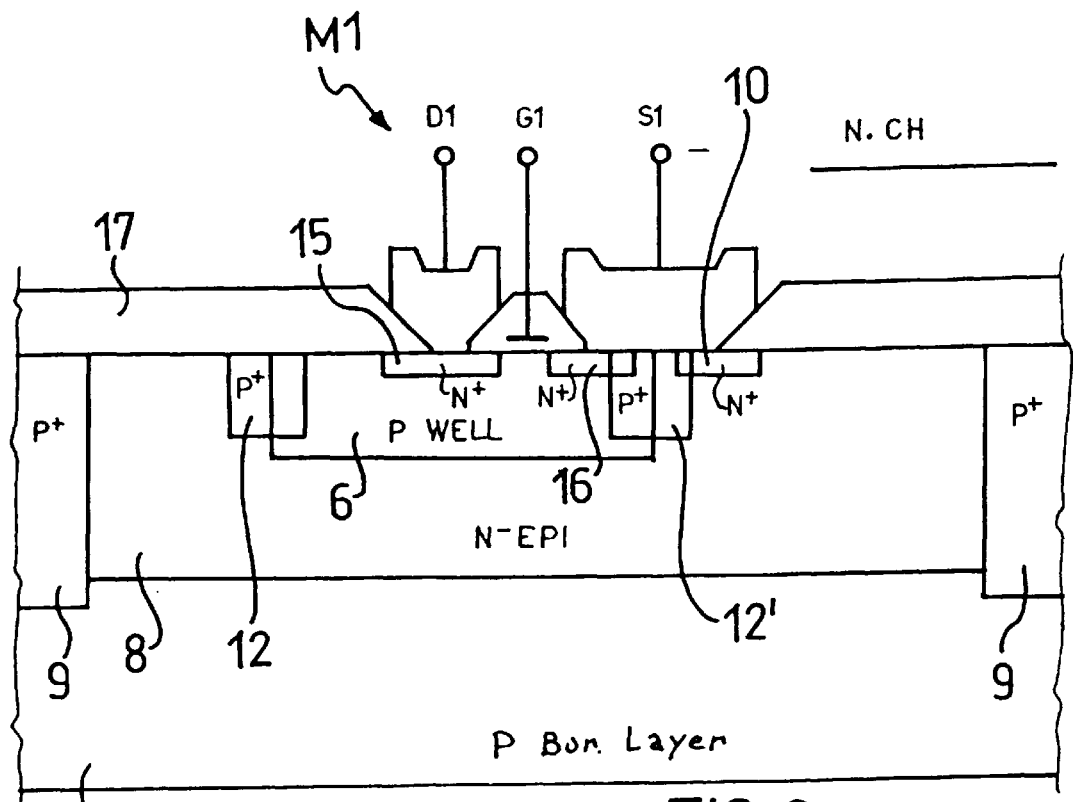
FIG. 8 is an enlarged scale view of a detail of the example shown in FIG. 7.
Figure 9:
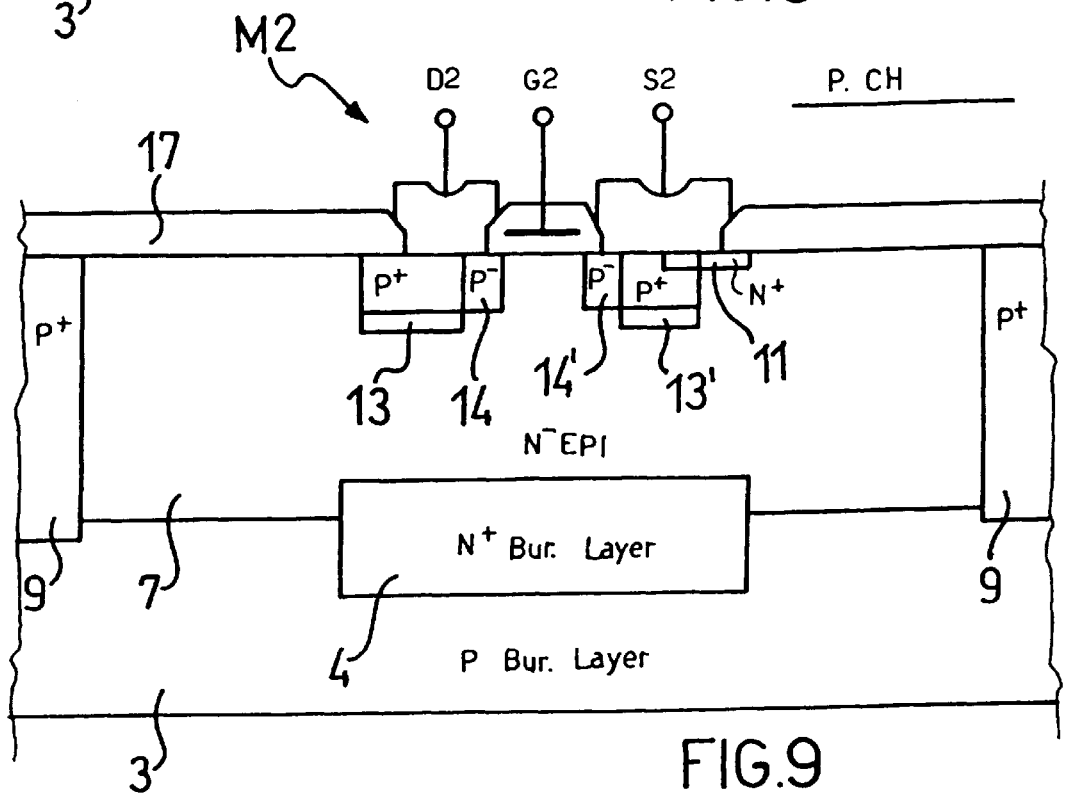
FIG. 9 is an enlarged scale view of a further detail of the example shown in FIG. 7.

The first MOS transistor M1 of the N-channel type and the second MOS transistor M2 of the P-channel type are respectively formed in the wells 6 and 7. For clarity of illustration, these transistors M1 and M2 have been shown in their final structure condition, separately and to an enlarged scale, in FIGS. 8 and 9.

An implantation and associated diffusion step of the second type of P dopant into the well 6 allows definition of deep body regions 12, 12' as well as the regions 13, 13' in the well 7.

At this time, a layer 17 of polysilicon is deposited onto the semiconductor surface and suitably doped to form the gates G1 and G2 of the MOS transistors M1 and M2.

This deposition step is followed by an implantation and diffusion step of dopant of the second P type into the third well 7 to form the drain and source active areas 14 and 14' of the P-channel transistor M2.

Conventional metallic contacts D2 and S2 are provided for the drain and source regions 14 and 14'.

Thereafter, another implantation and diffusion step is carried out in the second well 6, using the first type of N+ dopant, to form the drain and source active areas 15 and 16 of the transistor M1. Terminal contacts D1 and S1 are provided over these regions.

The fabricating process is completed by a step of definition and metallization of the drain contact areas D1, D2 and source contact areas S1, S2. The resultant device is as shown in FIG. 7.

Figure 2:
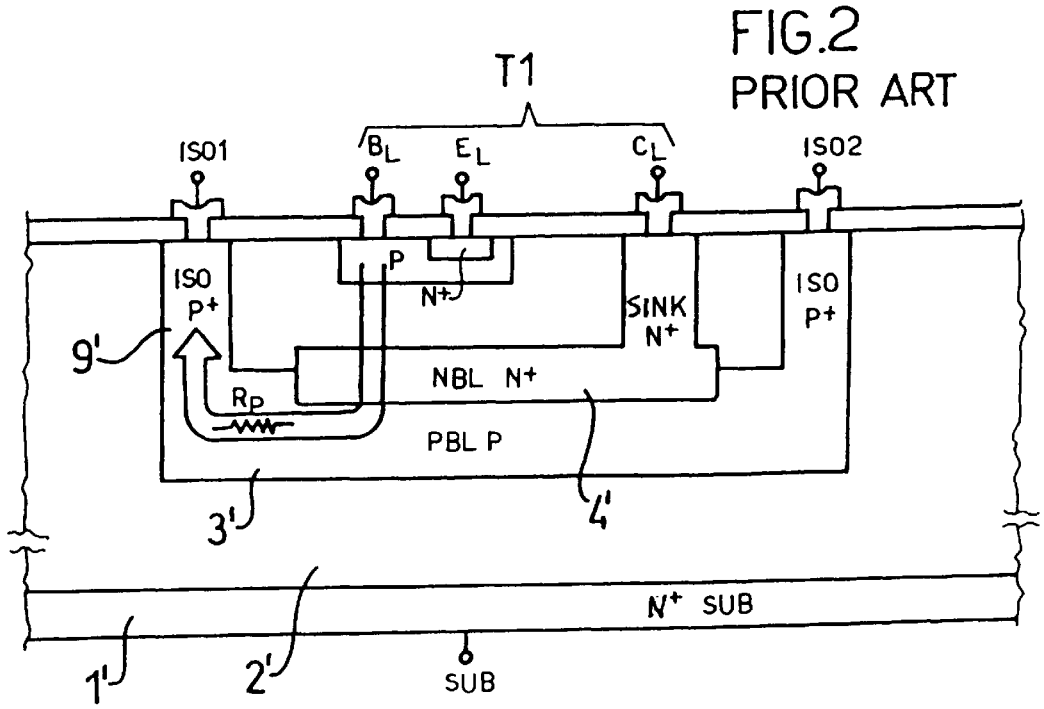
FIG. 2 shows schematically a detail of the circuit in FIG. 1.
Figure 3:
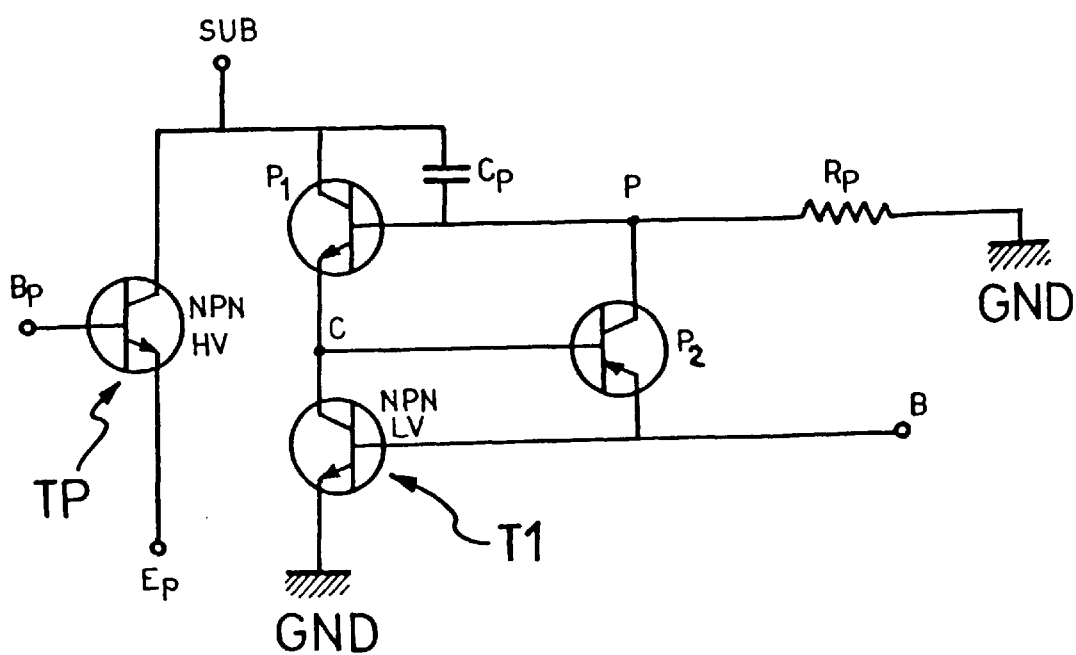
FIG. 3 shows an equivalent electric circuit of the detail in FIG. 2.
Figure 4B:
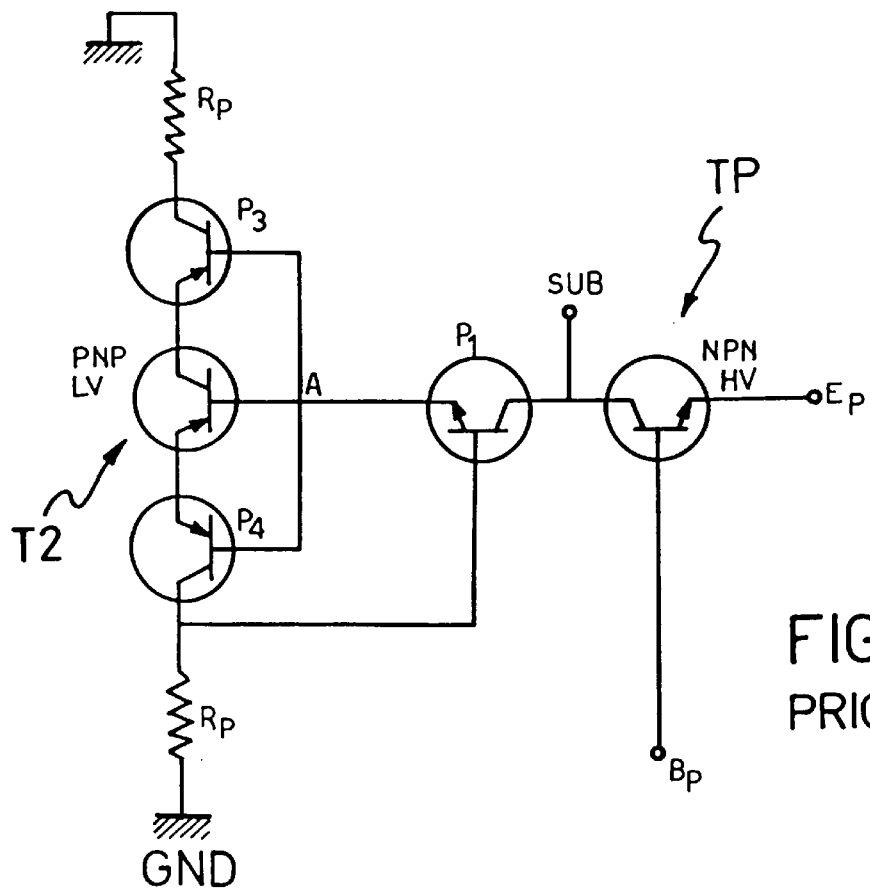
FIG. 4B shows an equivalent electric circuit of the detail in FIG. 4A.
Figure 4A:
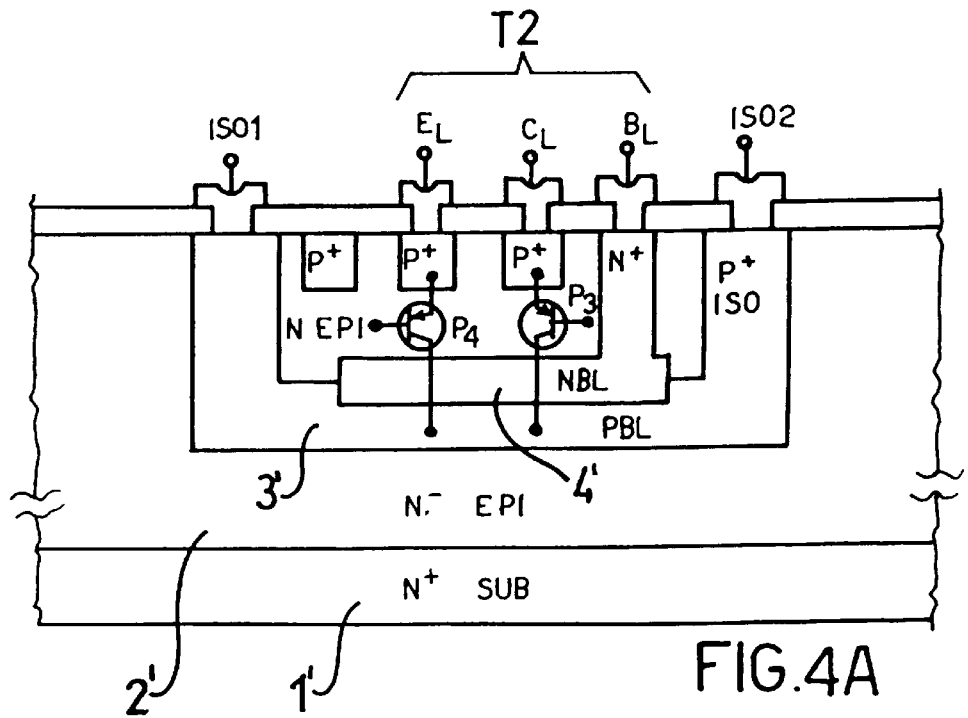
FIG. 4A shows schematically a further detail of the circuit in FIG. 1.

Advantageously, according to this invention, the transistor M1 has no buried layer of dopant of the first N type, as was instead the case with prior art bipolar transistors. It will be recalled, in fact, that the NPN transistor T1 of FIGS. 1 and 2 has its collector defined by the buried layer 4', which provides a near-vertical, substantially U-like current flow pattern.

The absence of a buried layer from the circuit of this invention causes the dopant, such as boron, used for the isolation well 3 to also diffuse in the upward direction. This poses no problems to the MOS transistor M1 of the N-channel type in the control circuit C of this invention because the current flow between the source S1 and the drain D1 of that transistor M1 takes place at the surface, which would not be reached by the dopant of the isolation well 3.

By eliminating the buried layer of the first dopant type, a first parasitic transistor P1, whose emitter is indeed formed by that layer, can also be suppressed.

Nor is there, in the control circuit C of this invention, any second parasitic transistor P2 such as affects, by contrast, all prior embodiments.

In fact, the source S1 of the transistor M1 is connected to the ground reference potential GND, and so is, therefore, the deep body region 12' to which that source S1 is connected. Thus, the emitter and base of the parasitic transistor P2 are shorted together and the transistor P2 cannot be turned on.

The buried layer 4 of the first type of N+ dopant is, however, still present in the well 7 where the P-channel transistor M2 is formed, which prevents shorting of the source S2 to the drain D2 of that transistor M2. Accordingly, the formation of the control transistor M2 will imply the presence of a parasitic transistor P1 due to the buried layer 4 provided.

Advantageously though, during normal operation of the control circuit C according to the invention, the P+-N junction between the region 13 and the well 7 of the control transistor M2 will at all times be reverse biased to prevent said parasitic transistor P1 from becoming turned on.

Furthermore, the source contact S2 stops operation of a further parasitic transistor P3 by shorting its base to its emitter, coincident with the regions 11 and 13'.

To sum it up, the control circuit C of this invention does remove the problems brought about by the appearance of parasitic elements, thereby overcoming the drawbacks of similar prior art circuits.

Note that, in the presently preferred embodiment, the well for NMOS elements advantageously does not use any underlying deep $N^+$ layer.

According to a disclosed class of innovative embodiments, there is provided: A control circuit for electronic power devices monolithically integrated on a semiconductor substrate which has been doped by a first dopant type and on which a first epitaxial layer doped by the same dopant type as the substrate has been grown, an isolation well doped by a second type of dopant being formed therein for at least a first transistor of the control circuit, characterized in that said first transistor is a field-effect transistor and is formed within a first well in direct contact with said isolation well.

According to another disclosed class of innovative embodiments, there is provided: An electronic semiconductor device monolithically integrated on a semiconductor substrate along with at least one power component and at least one transistor formed within an isolation well, characterized in that said transistor is a field-effect transistor and accommodated in a first well in direct contact with the isolation well.

According to another disclosed class of innovative embodiments, there is provided: A process for making a control circuit for electronic semiconductor devices monolithically integrated along with at least one power component, being of a type which comprises a first epitaxial layer growing step carried out using a first dopant type, a step of implantation of a second dopant type to define a buried layer for an isolation well, and a second growing step of a second epitaxial layer, characterized in that it comprises further implantation steps to first define said isolation well, enclosing at least a first well in the second epitaxial layer, and subsequently define a second well to accommodate at least one field-effect transistor and being housed within and in direct contact with said first well.

According to another disclosed class of innovative embodiments, there is provided: A power integrated circuit, comprising: a monolithic semiconductor substrate having a first conductivity type, and having a metallic conductor making ohmic contact to a back surface thereof, and having thereover a first buried layer which has a second conductivity type and is patterned to partially overlie the substrate, and a second buried layer which has the first conductivity type and is patterned to partially overlie the first buried layer, and an a first epitaxial layer which has the first conductivity type and is less heavily doped than the second buried layer and overlies portions thereof; a buried-emitter power bipolar transistor, comprising a portion of the first buried layer which forms a base-collector junction with the substrate and is connected to a base contact, and a portion of the second buried layer which overlies the portion of the first buried layer to form an emitter-base junction, and which is connected to an emitter contact; and control circuitry comprising at least one first-type insulated-gate field-effect transistor which has source/drain diffusions of the first conductivity type, and one second-type insulated-gate field-effect transistor which has source/drain diffusions of the second conductivity type, interconnected to control the power transistor: the first-type transistor being located inside a second-conductivity-type well in the epitaxial layer, and overlying a respective portion of the first buried layer but not overlying any portion of the second buried layer, and the second-type transistor being located inside a portion of the epitaxial layer, and overlying the respective portion of the second buried layer and also a respective portion of the first buried layer.

According to another disclosed class of innovative embodiments, there is provided: A power integrated circuit, comprising: a monolithic N-type semiconductor substrate, having thereover a patterned P-type buried layer, and an N-type patterned buried layer is patterned to partially overlie the P-type buried layer, and an N-type epitaxial layer which is less heavily doped than the N-type buried layer and overlies portions thereof; a buried-emitter power bipolar transistor, comprising a portion of the first buried layer which forms a base-collector junction with the substrate and is connected to a base contact, and a portion of the second buried layer which overlies the portion of the first buried layer to form an emitter-base junction, and which is connected to an emitter contact; and control circuitry comprising at least one N-channel and one P-channel insulated-gate field-effect transistor, interconnected to control the power transistor: the N-channel transistor being located inside a P-type well in the epitaxial layer, and overlying a respective portion of the P-type buried layer but not overlying any portion of the N-type buried layer, and the P-channel transistor being located inside an N-type well in the epitaxial layer, and overlying the respective portion of the P-type buried layer and also a respective portion of the N-type buried layer.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A process for making a control circuit for electronic semiconductor devices monolithically integrated along with at least one power component, being of a type which comprises a first epitaxial layer growing step carried out using a first dopant type, a step of implantation of a second dopant type to define an isolation well, and a second growing step of a second epitaxial layer, characterized in that it comprises further implantation steps to first define said isolation well, enclosing at least a first well in the second epitaxial layer, and subsequently define a second well to accommodate at least one field-effect transistor and being housed within and in direct contact with said first well wherein said further implantation steps result in an additional well to accommodate a second field-effect transistor being defined in the second epitaxial layer, said additional well being in turn protected by said isolation well.

2. A process according to claim 1, wherein before the last epitaxial layer growing step, an intermediate step of implantation of the first dopant type is carried out over said buried layer to define a second buried layer interposed between said additional well accommodating the second transistor and said isolation well.

3. A process according to claim 1, wherein said at least one transistor is an N-channel MOS transistor.

4. A process according to claim 1, wherein the active areas of at least one transistor are formed by implantation along with their related body regions.

5. A method for making a circuit for controlling a power transistor device comprising the steps of:

on a semiconductor substrate doped with a first concentration level of a first conductivity type, growing a first epitaxial layer having a second concentration level of the first conductivity type;

forming, in the first epitaxial layer, an isolation well having a second conductivity type, the isolation well separating the control circuit from the power transistor;

depositing in the isolation well a first well having the first conductivity type, and in direct contact with the isolation well; and defining an MOS transistor having a channel of the first conductivity type within the first well;

depositing, in the isolation well, a second well having the first conductivity type; and defining an MOS transistor having a channel of the second conductivity type within the second well;

wherein both MOS transistors are included in the control circuit for the power bipolar transistor.

6. The method of claim 5 wherein the step of forming the isolation well is accomplished by ion implanting a dopant in the first epitaxial layer.

7. The method of claim 5 wherein step of defining an MOS transistor having a channel of the second conductivity type further includes the step of depositing a buried layer of the second conductivity type located within the second well.

8. In a monolithically integrated circuit having a power transistor, the integrated circuit formed in a substrate of a first dopant type and the substrate having a first epitaxial layer, a method of making a control circuit comprising:

implanting a first concentration of a second dopant type to form an isolation well;

growing a second epitaxial layer;

forming a first well having the first dopant type in the isolation well;

forming a second well having the second dopant type, the second well formed within the first well;

depositing a source and a drain into the second well for a first MOS transistor;

in an area of the isolation well separate from the first well, depositing a buried layer of the first type;

in an area adjacent to the buried layer, forming a third well having the first dopant type; and depositing a second source and a second drain in the third well for a second MOS transistor.

9. The method of claim 7 wherein depositing a buried layer precedes growing a second epitaxial layer.

10. The method of claim 7, wherein the first dopant type is N-type.

* * * * *